United States Patent
Plesski et al.

(10) Patent No.: US 11,251,775 B2
(45) Date of Patent: *Feb. 15, 2022

(54) FILM BULK ACOUSTIC RESONATORS IN THIN LN-LT LAYERS

(71) Applicant: Resonant Inc., Goleta, CA (US)

(72) Inventors: Viktor Plesski, Gorgier (CH); Julius Koskela, Helsinki (FI)

(73) Assignee: Resonant Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/125,779

(22) Filed: Dec. 17, 2020

(65) Prior Publication Data
US 2021/0119604 A1    Apr. 22, 2021

Related U.S. Application Data

(63) Continuation of application No. 17/090,599, filed on Nov. 5, 2020, now Pat. No. 10,944,380, which is a continuation of application No. 16/932,719, filed on Jul. 18, 2020, now Pat. No. 10,862,454.

(60) Provisional application No. 62/958,851, filed on Jan. 9, 2020, provisional application No. 62/875,855, filed on Jul. 18, 2019.

(51) Int. Cl.
| | | |
|---|---|---|
| H03H 9/205 | (2006.01) | |
| H03H 9/56 | (2006.01) | |
| H03H 9/02 | (2006.01) | |
| H03H 9/13 | (2006.01) | |

(52) U.S. Cl.
CPC .......... *H03H 9/205* (2013.01); *H03H 9/0211* (2013.01); *H03H 9/02015* (2013.01); *H03H 9/131* (2013.01); *H03H 9/564* (2013.01)

(58) Field of Classification Search
CPC .... H03H 9/205; H03H 9/131; H03H 9/02015; H03H 9/0211; H03H 9/564
See application file for complete search history.

(56) References Cited

U.S. PATENT DOCUMENTS

| | | |
|---|---|---|
| 5,853,601 A | 12/1998 | Krishaswamy et al. |
| 6,540,827 B1 | 4/2003 | Levy et al. |
| 6,707,229 B1 | 3/2004 | Martin |
| (Continued) | | |

FOREIGN PATENT DOCUMENTS

| | | |
|---|---|---|
| WO | 2016017104 | 2/2016 |
| WO | 2018003273 A1 | 1/2018 |

OTHER PUBLICATIONS

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

(Continued)

*Primary Examiner* — Jeffrey M Shin
(74) *Attorney, Agent, or Firm* — Socal IP Law Group LLP; John E. Gunther

(57) ABSTRACT

Acoustic resonator devices, filter devices, and methods of fabrication are disclosed. A resonator device includes a single-crystal piezoelectric plate having a front surface and a back surface opposite the front surface, wherein the back surface is coupled to a surface of a substrate. A floating back-side conductor pattern is formed on a portion of the back surface. A front-side conductor pattern including two electrodes is formed on a portion of the front surface opposite the back-side conductor.

18 Claims, 10 Drawing Sheets

(56) References Cited

U.S. PATENT DOCUMENTS

| | | | |
|---|---|---|---|
| 7,463,118 | B2 | 12/2008 | Jacobsen |
| 7,535,152 | B2 | 5/2009 | Ogami et al. |
| 7,684,109 | B2 | 3/2010 | Godshalk et al. |
| 7,868,519 | B2 | 1/2011 | Umeda |
| 8,278,802 | B1 | 10/2012 | Lee et al. |
| 8,344,815 | B2 | 1/2013 | Yamanaka |
| 8,829,766 | B2 | 9/2014 | Milyutin et al. |
| 8,932,686 | B2 | 1/2015 | Hayakawa et al. |
| 9,130,145 | B2 | 9/2015 | Martin et al. |
| 9,219,466 | B2 | 12/2015 | Meltaus et al. |
| 9,276,557 | B1 | 3/2016 | Nordquist et al. |
| 9,369,105 | B1 | 6/2016 | Li |
| 9,425,765 | B2 | 8/2016 | Rinaldi |
| 9,525,398 | B1 | 12/2016 | Olsson |
| 9,748,923 | B2 | 8/2017 | Kando et al. |
| 9,780,759 | B2 | 10/2017 | Kimura et al. |
| 10,200,013 | B2 | 2/2019 | Bower et al. |
| 10,491,192 | B1 | 11/2019 | Plesski et al. |
| 10,601,392 | B2 | 3/2020 | Plesski et al. |
| 10,637,438 | B2 | 4/2020 | Garcia et al. |
| 10,756,697 | B2 | 8/2020 | Plesski et al. |
| 10,790,802 | B2 | 9/2020 | Yantchev et al. |
| 10,797,675 | B2 | 10/2020 | Plesski |
| 10,826,462 | B2 | 11/2020 | Plesski et al. |
| 2002/0079986 | A1 | 6/2002 | Ruby et al. |
| 2002/0158714 | A1 | 10/2002 | Kaitila et al. |
| 2003/0199105 | A1 | 10/2003 | Kub et al. |
| 2004/0261250 | A1 | 12/2004 | Kadota et al. |
| 2007/0194863 | A1 | 8/2007 | Shibata et al. |
| 2010/0064492 | A1 | 3/2010 | Tanaka |
| 2010/0123367 | A1 | 5/2010 | Tai et al. |
| 2011/0109196 | A1 | 5/2011 | Goto |
| 2011/0278993 | A1 | 11/2011 | Iwamoto |
| 2013/0234805 | A1 | 9/2013 | Takahashi |
| 2013/0321100 | A1 | 12/2013 | Wang |
| 2014/0145556 | A1 | 5/2014 | Kadota |
| 2014/0151151 | A1 | 6/2014 | Reinhardt |
| 2014/0152145 | A1 | 6/2014 | Kando et al. |
| 2014/0173862 | A1 | 6/2014 | Kando et al. |
| 2015/0319537 | A1 | 11/2015 | Perois et al. |
| 2015/0333730 | A1 | 11/2015 | Meltaus |
| 2016/0028367 | A1 | 1/2016 | Shealy |
| 2016/0182009 | A1 | 6/2016 | Bhattacharjee |
| 2017/0063332 | A1 | 3/2017 | Gilbert et al. |
| 2017/0179928 | A1 | 6/2017 | Raihn et al. |
| 2017/0214387 | A1 | 7/2017 | Burak et al. |
| 2017/0222622 | A1 | 8/2017 | Solal et al. |
| 2017/0288629 | A1* | 10/2017 | Bhattacharjee .... H03H 9/02015 |
| 2017/0370791 | A1 | 12/2017 | Nakamura et al. |
| 2018/0123016 | A1 | 5/2018 | Gong et al. |
| 2018/0191322 | A1 | 7/2018 | Chang et al. |
| 2019/0068164 | A1 | 2/2019 | Houlden et al. |
| 2019/0131953 | A1 | 5/2019 | Gong |
| 2019/0273480 | A1 | 9/2019 | Lin |

OTHER PUBLICATIONS

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A . . . (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Y-cut X-propagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Webster Dictionary Meaning of "diaphragm" Merriam Webster since 1828.

Safari et al. "Piezoelectric for Transducer Applications" published by Elsevier Science Ltd., pp. 4 (Year: 2000).

Moussa et al. Review on Triggered Liposomal Drug Delivery with a Focus on Ultrasound 2015, Bentham Science Publishers, pp. 16 (Year 2005).

Acoustic Properties of Solids ONDA Corporation 592 Weddell Drive, Sunnyvale, CA 94089, Apr. 11, 2003, pp. 5 (Year 2003).

Bahreynl, B. Fabrication and Design of Resonant Microdevices Andrew William, Inc. 2018, NY (Year 2008).

Material Properties of Tibtech Innovations, © 2018 TIBTECH Innovations (Year 2018).

\* cited by examiner

FILM BULK ACOUSTIC RESONATORS IN THIN LN-LT LAYERS

RELATED APPLICATION INFORMATION

This patent is a continuation of patent application Ser. No. 17/090,599, entitled FILM BULK ACOUSTIC RESONATORS IN THIN LN-LT LAYERS, filed Nov. 5, 2020, now U.S. Pat. No. 10,944,380, which is a continuation of patent application Ser. No. 16/932,719, entitled FILM BULK ACOUSTIC RESONATORS IN THIN LN-LT LAYERS, filed Jul. 18, 2020, now Pat. No. 10,862,454, which claims priority from provisional patent application Ser. No. 62/875,855, entitled FILM ACOUSTIC RESONATORS IN THIN LN-LT LAYERS, filed Jul. 18, 2019, and provisional application No. 62/958,851, entitled YBAR ON ROTATED Y-CUTS OF LN, filed Jan. 9, 2020, the entire contents of each are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™(Long Term Evolution) specification defines frequency bands from 3.3 GHz to 5.9 GHz. Some of these bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Figure 1:
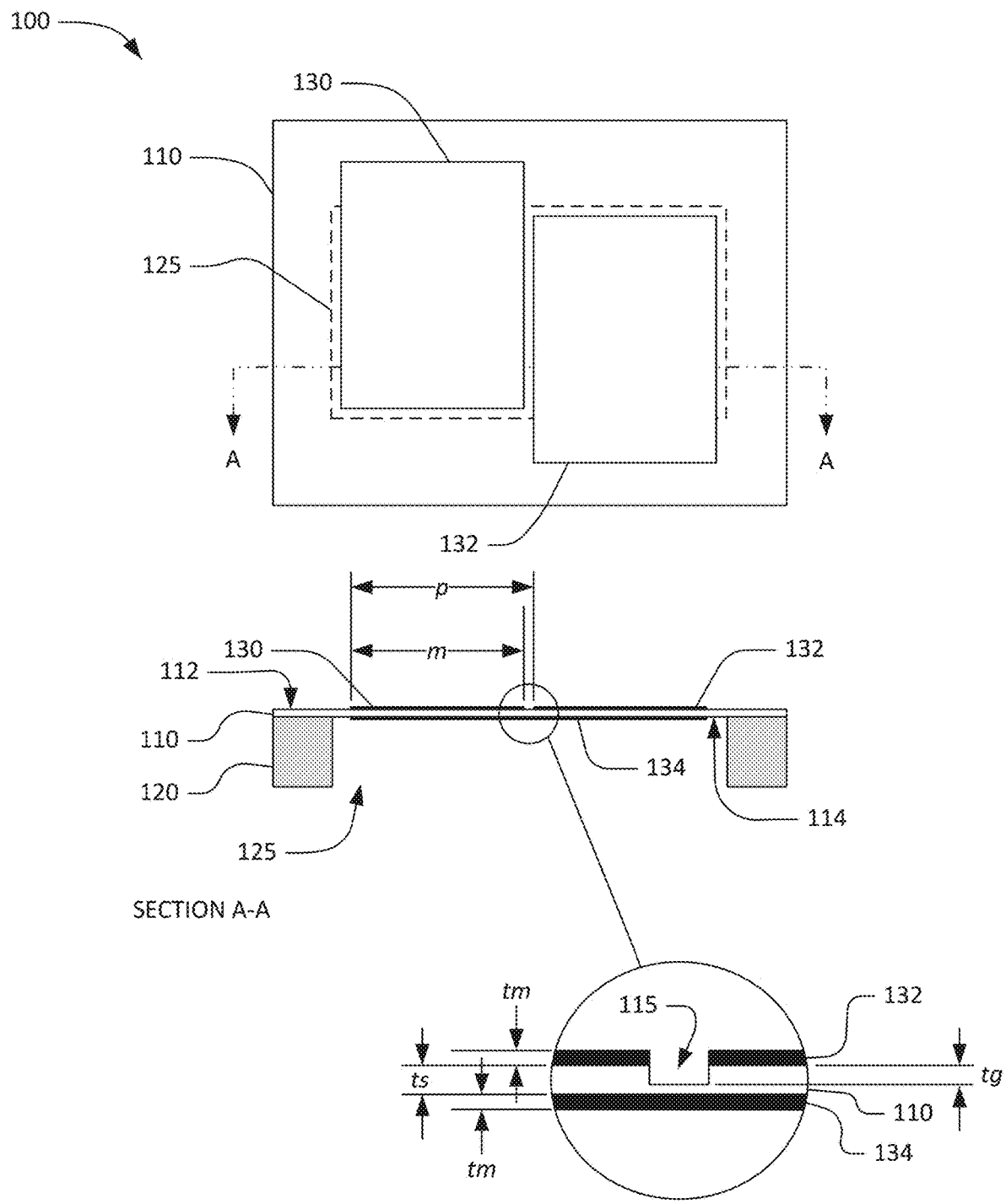
FIG. 1 includes a schematic plan view and schematic cross-sectional views of a one section (one period) of a Y-cut film bulk acoustic resonator (YBAR).

FIG. 1 shows a simplified top view and a cross-sectional view of one period of a Y-cut film bulk acoustic resonator (YBAR) 100. The YBAR 100 is made up of a piezoelectric plate 110 having parallel front and back surfaces 112, 114, respectively. The piezoelectric plate is a thin single-crystal layer of a piezoelectric material such as lithium niobate (LN), lithium tantalate (LT), lanthanum gallium silicate, or gallium nitride. The piezoelectric plate is cut such that the orientation of the X, Y, and Z crystalline axes with respect to the front and back surfaces is known and consistent.

The back surface 114 of the piezoelectric plate 110 is attached to a substrate 120 that provides mechanical support to the piezoelectric plate 110. The substrate 120 may be, for example, silicon, sapphire, quartz, or some other material. The piezoelectric plate 110 may be bonded to the substrate 120 using a wafer bonding process, or grown on the substrate 120, or attached to the substrate in some other manner. The piezoelectric plate may be attached directly to the substrate or may be attached to the substrate via one or more intermediate material layers.

A cavity 125 is formed in the substrate 120 such that the portion of the piezoelectric plate 110 containing front-side conductor patterns 130, 132 is suspended over the cavity 125 without contacting the substrate 120. "Cavity" has its conventional meaning of "an empty space within a solid body." The cavity 125 may be a hole completely through the substrate 120 (as shown in Section A-A) or a recess in the substrate 120 that does not extend through the substrate 120. The cavity 125 may be formed, for example, by selective etching of the substrate 120 before or after the piezoelectric plate 110 and the substrate 120 are attached. As shown in FIG. 1, the cavity 125 has a rectangular shape. A cavity of a YBAR may have a different shape, such as a regular or irregular polygon. The cavity of a YBAR may more or fewer than four sides, which may be straight or curved.

First front-side conductor pattern 130 and second front-side conductor pattern 132 are formed on the first surface 112 of the piezoelectric plate 110. A third back-side conductor pattern 134 is formed on the second surface 114 of the piezoelectric plate 110. The back-side conductor pattern 134 can be a "floating" conductor pattern, meaning that is not electrically connected to any other conductor. The conductor patterns may be molybdenum, aluminum, copper, or some other conductive metal or alloy. The portion of the piezoelectric plate 110 between the first front-side conductor pattern 130 and the back-side conductor pattern 134 forms a first resonator. The portion of the piezoelectric plate 110 between the second front-side conductor pattern 132 and the back-side conductor pattern 134 forms a second resonator. The first and second resonators are electrically in series such that an RF signal applied between the first and second front-side conductor patterns 130, 132 excites acoustic waves in both the first and second resonators.

The piezoelectric plate may be X-cut or Y-cut (i.e. with the X or Y crystalline axis of the piezoelectric material normal to the surfaces 112, 114). In this case, an RF signal applied between the first and second front-side conductor patterns 130, 132 will excite shear acoustic waves in both the first and second resonators. Rotated Y-cuts can be used to achieve shear displacements exclusively in the sagittal plane, and to control the electromechanical coupling of the resonators.

As shown in FIG. 1, the first and second front-side conductor patterns 130, 132 each consist of a single electrode, and the conductor patterns 130, 132, 134 are rectangular in shape. The conductor patterns may be non-rectangular (e.g. trapezoidal), curved, or irregular to suppress parasitic acoustic modes.

Figure 2:
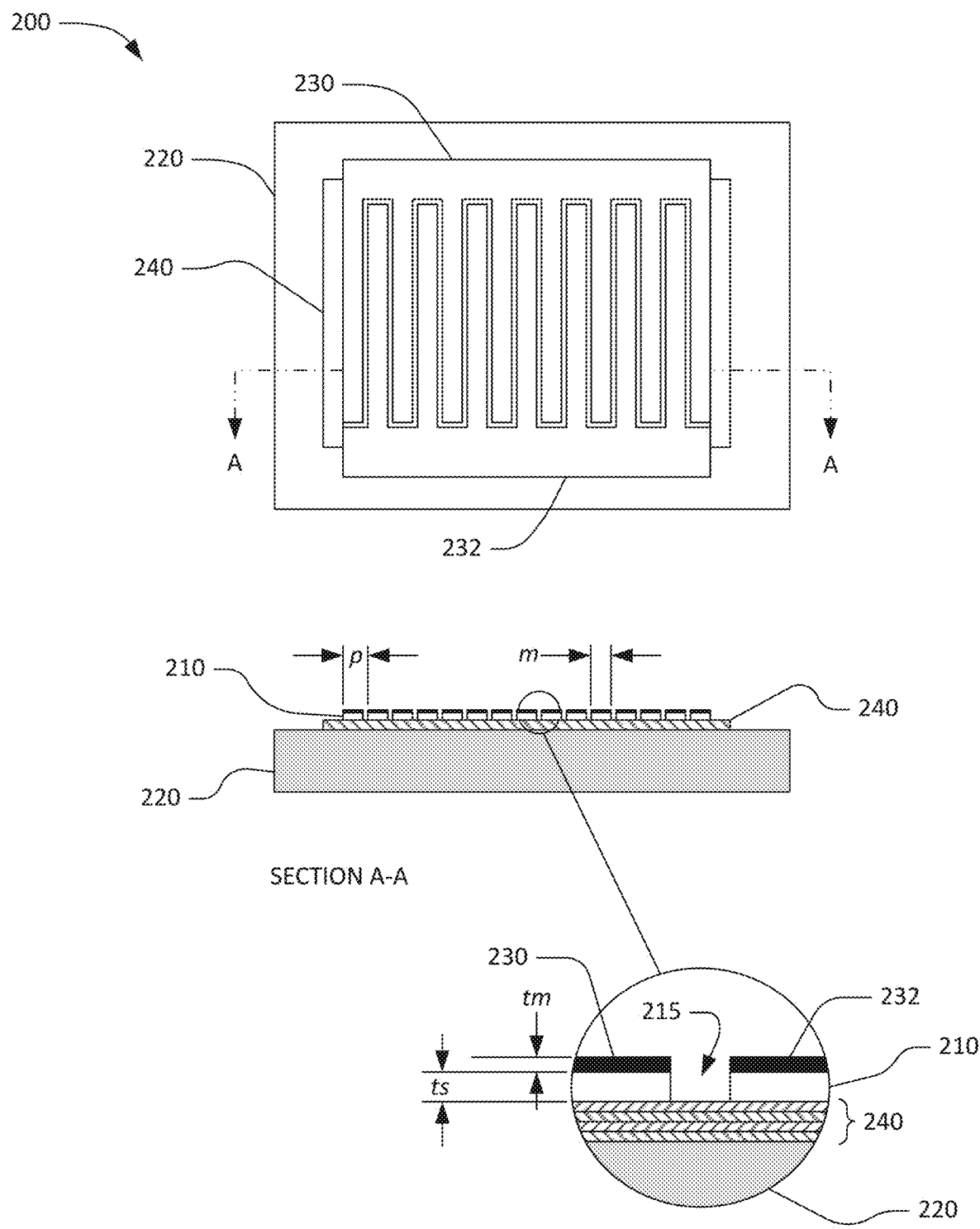
FIG. 2 includes a schematic plan view and schematic cross-sectional views of a solidly-mounted Y-cut film bulk acoustic resonator (SM YBAR).

Alternatively, the first and second front-side conductor patterns 130, 132 may form an interleaved finger pattern (IFP) (not shown in FIG. 1, but similar to IFP 230 of FIG. 2). In this case, the first front-side conductor pattern 130 includes a first plurality of parallel fingers extending from a first busbar. The second front-side conductor pattern 132 includes a second plurality of parallel fingers extending from a second busbar. The first and second pluralities of parallel fingers are interleaved. The width m of each finger will be a substantial portion of the pitch p, or center-to-center spacing, of the fingers.

In the detailed cross-sectional view, the thickness of the piezoelectric plate 110 is dimension ts and the thickness of the conductor patterns 130, 132, 134 is dimension tm. The thickness ts of the piezoelectric plate may be, for example, 100 nm to 1000 nm. The thickness tm of the conductor patterns 130, 132, 134 may be, for example, 10 nm to 500 nm. The thickness of the conductor patterns may be the same or one conductor pattern may have a different thickness from the others.

The piezoelectric plate 110 may be etched or otherwise removed, completely or only partially, in the area between the first and second front-side conductor patterns 130, 132, forming slots 115. The presence of the slots 115 may suppress lateral acoustic modes that might be excited by the electric field between the front-side conductor patterns 130, 132. A depth tg of the slot 115 can extend partially or completely through the piezoelectric plate 110.

FIG. 2 shows a simplified schematic top view and a cross-sectional view of a solidly-mounted Y-cut film bulk acoustic resonator (SM YBAR) 200. The SM YBAR 200 includes a piezoelectric plate 210 having parallel front and back surfaces (shown in the cross-sectional view). The piezoelectric plate 210 is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. The piezoelectric plate may be Z-cut, X-cut, Y-cut or rotated Y-cut as previously described.

First and second front-side conductor patterns 230, 232 are formed on the front surface of the piezoelectric plate 210. The first and second front-side conductor patterns 230, 232 form an interleaved finger pattern. The first front-side conductor pattern 230 includes a first plurality of parallel fingers extending from a first busbar. The second front-side conductor pattern 232 includes a second plurality of parallel fingers extending from a second busbar. The first and second pluralities of parallel fingers are interleaved. The width m of each finger will be a substantial portion of the pitch p, or center-to-center spacing, of the fingers. The first and second front-side conductor patterns 230, 232, are not necessarily an IFP, but may be single electrodes similar to conductor patterns 130, 132 shown in FIG. 1.

The back surface of the piezoelectric plate 210 is attached to, and mechanically supported by, a substrate 220. The substrate 220 may be, for example, silicon, sapphire, quartz, or some other material. Unlike the YBAR 100 of FIG. 1, there is not a cavity in the substrate under the conductor patterns. Instead, an acoustic Bragg reflector 240 is sandwiched between the substrate 220 and the back surface of the piezoelectric plate 210. The term "sandwiched" means the acoustic Bragg reflector 240 is both disposed between and physically connected to a surface of the substrate 220 and the back surface of the piezoelectric plate 210. In some circumstances, thin layers of additional materials may be disposed between the acoustic Bragg reflector 240 and the surface of the substrate 220 and/or between the acoustic Bragg reflector 240 and the back surface of the piezoelectric plate 210. Such additional material layers may be present, for example, to facilitate bonding the piezoelectric plate 210, the acoustic Bragg reflector 240, and the substrate 220.

The acoustic Bragg reflector 240 includes multiple layers that alternate between materials having high acoustic impedance and materials having low acoustic impedance. "High" and "low" are relative terms. For each layer, the standard for comparison is the adjacent layers. Each "high" acoustic impedance layer has an acoustic impedance higher than that of both the adjacent low acoustic impedance layers. Each "low" acoustic impedance layer has an acoustic impedance lower than that of both the adjacent high acoustic impedance layers. Each of the layers has a thickness equal to, or about, one-fourth of the acoustic wavelength at or near a resonance frequency of the SM XBAR 200. Materials having comparatively low acoustic impedance include silicon dioxide, silicon oxycarbide, aluminum, titanium, and certain plastics such as cross-linked polyphenylene polymers. Materials having comparatively high acoustic impedance include silicon nitride, aluminum nitride, silicon carbide, and metals such as molybdenum, tungsten, gold, and platinum. All of the high acoustic impedance layers of the acoustic Bragg reflector 240 are not necessarily the same material, and all of the low acoustic impedance layers are not necessarily the same material. Preferably, the high acoustic impedance layer nearest the piezoelectric plate will be a conductive metal, which performs the function of the third conductor pattern (134 in FIG. 1). In the example of FIG. 2, the acoustic Bragg reflector 240 has a total of four layers. An acoustic Bragg reflector may have more than, or less than, four layers.

The piezoelectric plate may be etched or otherwise removed, completely or only partially, in the area between the first and second front-side conductor patterns 230, 232, forming slots 215. The presence of the slots 215 may suppress lateral acoustic modes that might be excited by the electric field between the front-side conductor patterns 230, 232. A slot may also be formed between the first and second front-side conductor patterns 130, 132 of the YBAR 100 if the back-side conductor pattern 134 is sufficiently thick to provide mechanical support to the piezoelectric plate 110.

Figure 3:
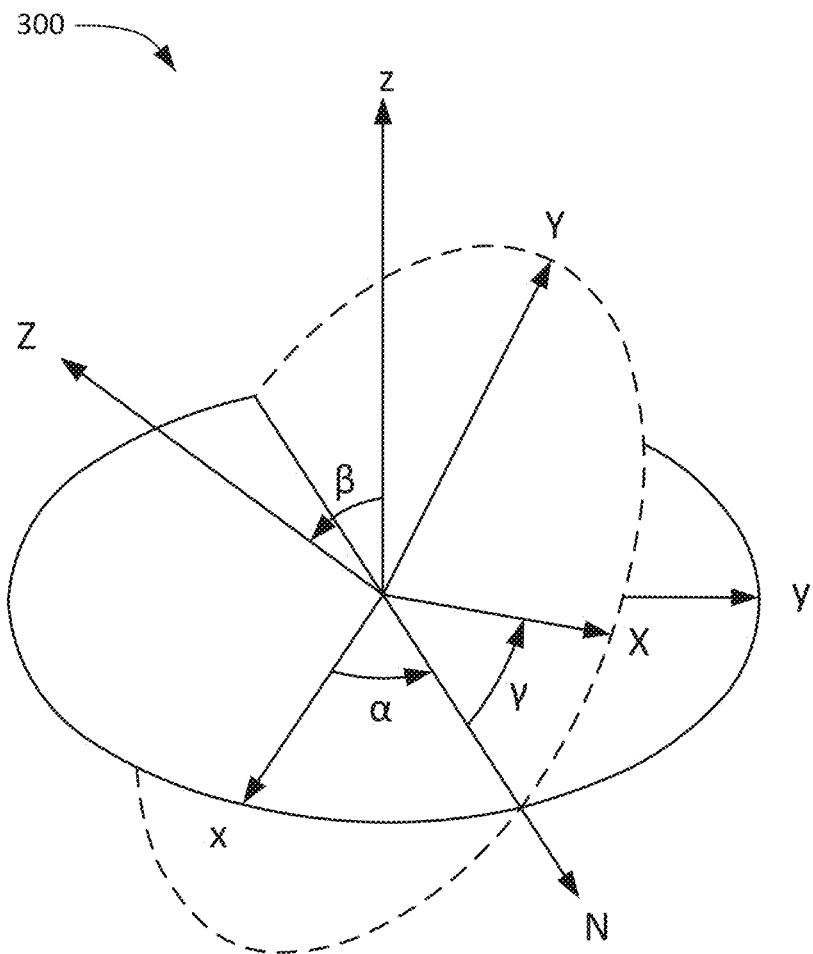
FIG. 3 is a graphical representation of Euler angles.

FIG. 3 is a graphical illustration of Euler angles 300. Euler angles are a system, introduced by Swiss mathematician Leonhard Euler, to define the orientation of a body with respect to a fixed coordinate system. The orientation is defined by three successive rotations about angles $\alpha$, $\beta$, and $\gamma$.

As applied to acoustic wave devices, xyz is a three-dimensional coordinate system aligned with the crystalline axes of the piezoelectric material. XYZ is a three-dimensional coordinate system aligned with the acoustic wave device, where the Z axis is normal to the surface of the piezoelectric material and XY is the plane of the surface of the piezoelectric material. The vector N is the intersection of the XY and xy planes. The vector N is also the common perpendicular to the z and Z axis.

Figure 4:
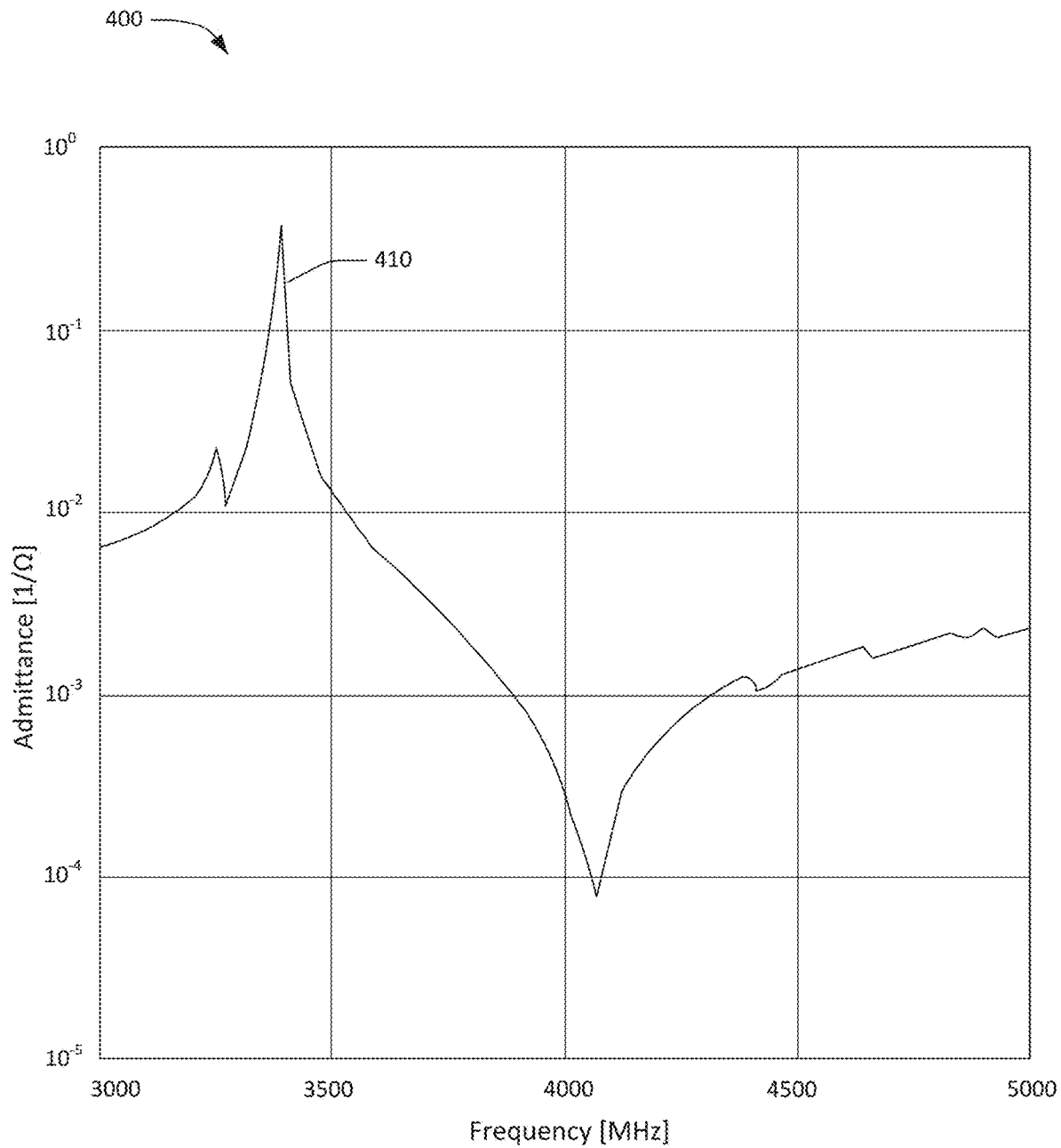
FIG. 4 is a chart of admittance as function of frequency of an exemplary SM YBAR.

FIG. 4 is a chart 400 of absolute value of admittance as function of frequency of an SM YBAR similar to the SM YBAR of FIG. 2 with an acoustic Bragg reflector and slots similar to slots 215. In this example, the piezoelectric plate is formed of lithium niobate and the Euler angles are (0, 90°, 0) such that the Y-crystalline axis is normal to the piezoelectric plate and the Z-crystalline axis is parallel to slots between the front-side conductor patterns. tm is 100 nm, ts is 400 nm, p is 5 um, and m is 4.5 um. In this periodic simulation, the resonance frequency Fr is 3389 MHz, as shown in curve 410. Q is 416. In this example, spurious modes have been reduced due to the presence of gaps in LN preventing excitation of horizontally propagating waves.

In other YBARs, rotated Y-cut LN piezoelectric plates provide tunable coupling through adjustment of the angle of rotation, particularly for piezoelectric plates with slots corresponding to the conductor patterns. Different crystal orientations of the piezoelectric plates with different couplings can be used to adapt the YBAR to the different filter specifications. Using a rotated Y-cut LN piezoelectric plate allows only one shear mode to be excited, which reduces parasitic modes compared to other crystal cuts.

Figure 5:
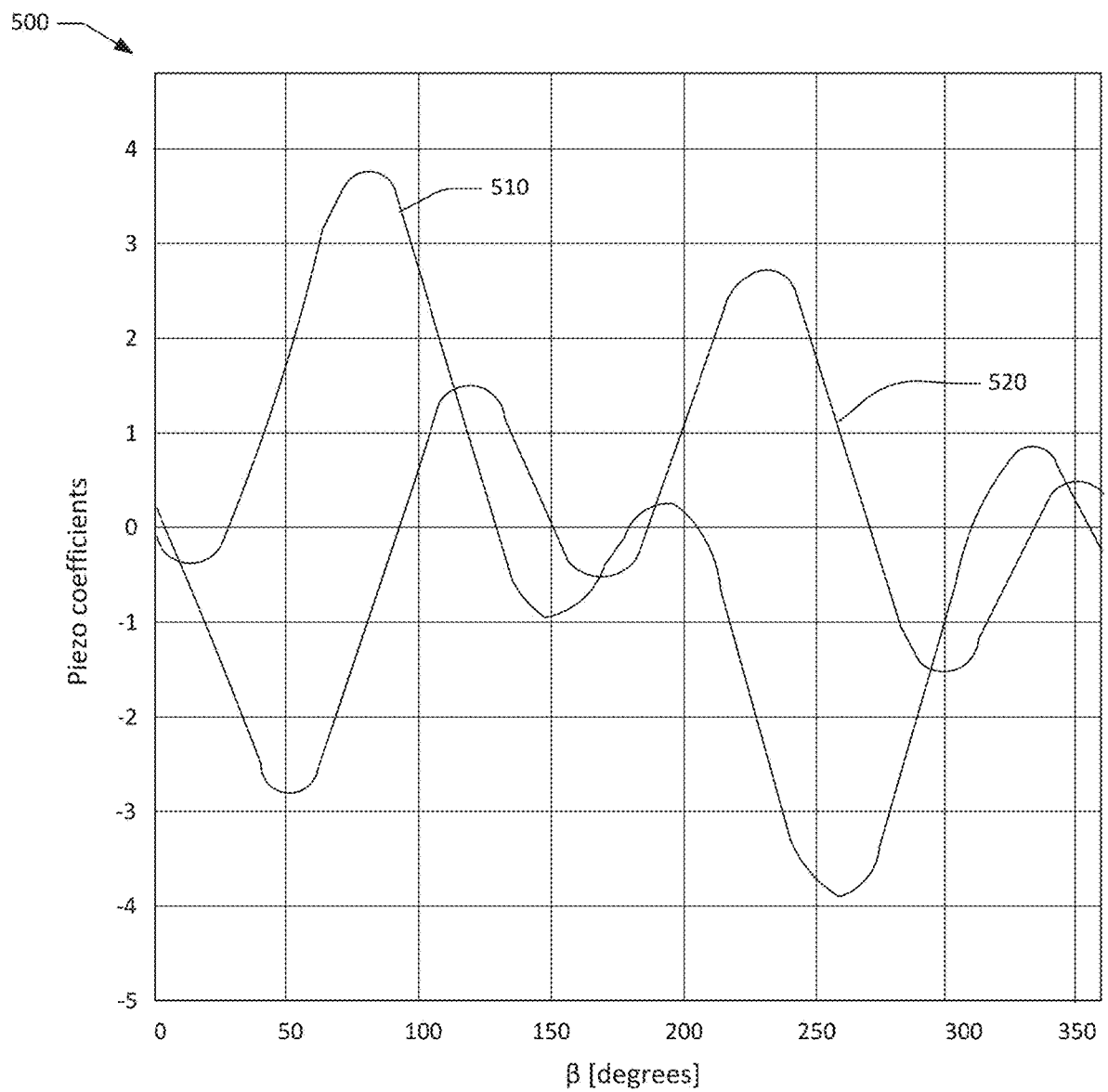
FIG. 5 is a chart of piezo coefficients as a function of the second Euler angle β for lithium niobate.

FIG. 5 is a chart of piezo coefficients as a function of $\beta$ of an exemplary YBAR. Curve 510 shows piezo coefficients for the piezo constant e34, demonstrating coupling to the vertical electric field directed perpendicular to the piezoelectric plate along the Z-axis for angles of $\beta$. Curve 510 shows that coupling to shear wave is maximal for a rotated Y-cut piezoelectric plate that has a rotation angle $\beta$ of 81.5 degrees. Curve 520 shows the piezo coefficients for the piezo constant e32, with e32 close to zero for $\beta$=81.5 degrees. This indicates that there are minimal or no undesirable compression waves in the y-direction. Rotation angle $\beta$ is not restricted to any particular angle and can be tuned for particular applications to an angle that will provide desirable results. In one example, rotation angle $\beta$ can be in a range from 60 degrees to 100 degrees or 70 degrees to 90 degrees.

Figure 6:
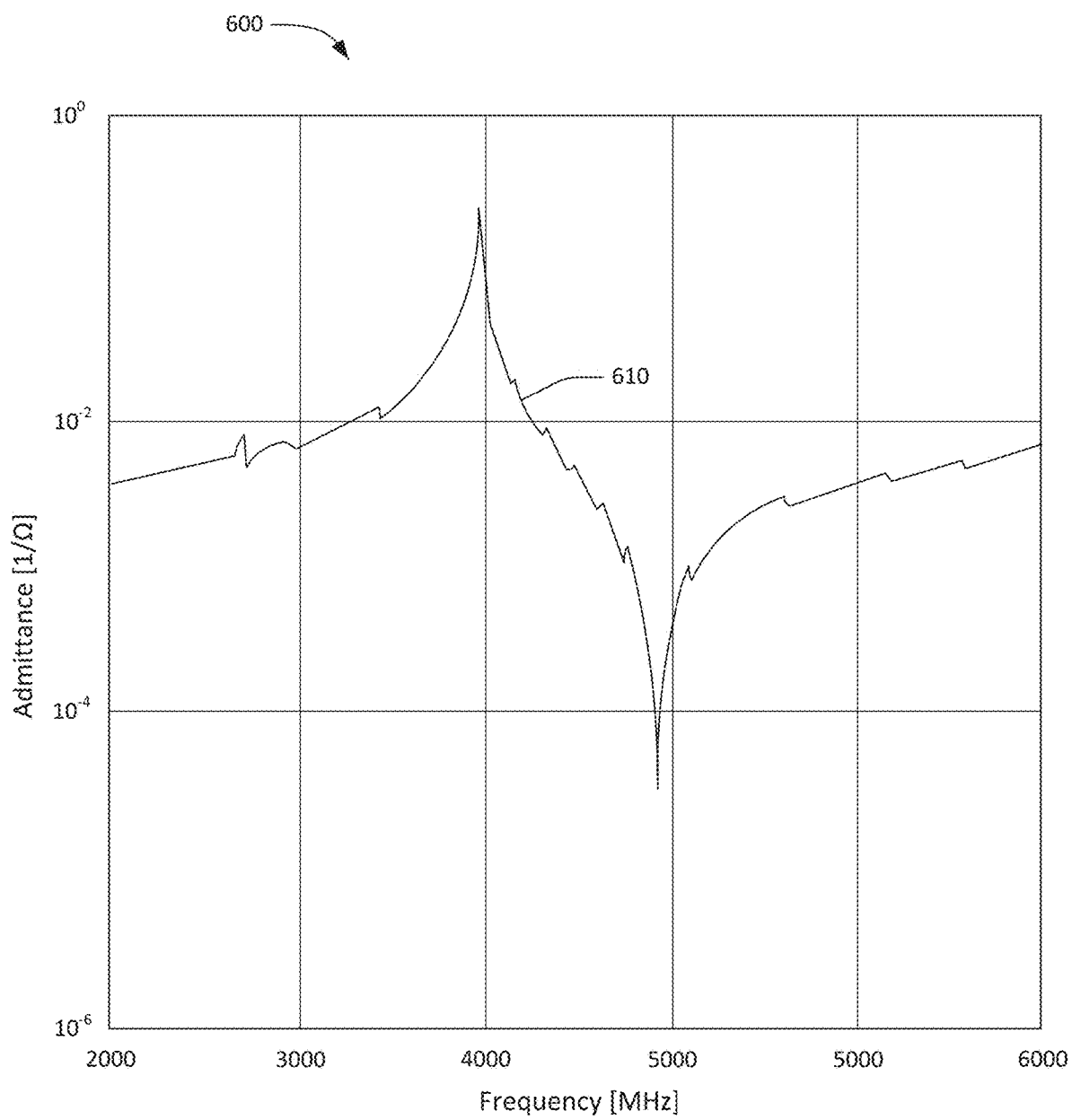
FIG. 6 is a chart of admittance as a function of frequency of an exemplary YBAR.

FIG. 6 is a chart of absolute value of admittance as a function of frequency for an exemplary YBAR with non-rectangular electrodes a rotated Y-cut piezoelectric plate that has a rotation angle $\beta$ of 81.5 degrees and a floating back-side conductor pattern. In this example, the conductor patterns are formed of Aluminum, p is 10 um, m is 8 um, tm is 50 nm, is is 400 nm. Curve 610 shows resonance frequency is 3937.796 MHz, resonance Q is 560, resonance admittance is 1.294, antiresonance frequency is 4928.785 MHz, antiresonance Q is 600, and resonance to antiresonance ratio is 22.3% (991 MHz). In this example, resonance to antiresonance ratio is improved and spurious modes are reduced due to the presence of gaps in LN preventing excitation of horizontally propagating waves.

Figure 7A:
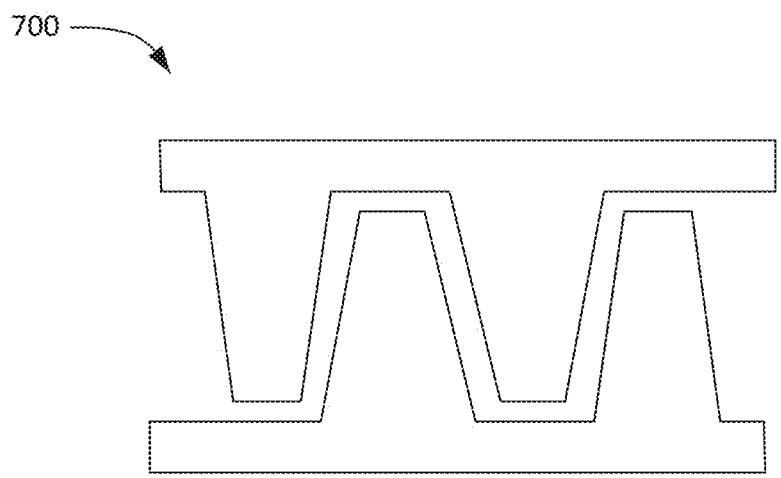
FIG. 7A is a graphic illustrating a non-rectangular electrode shape for a YBAR.
Figure 7B:
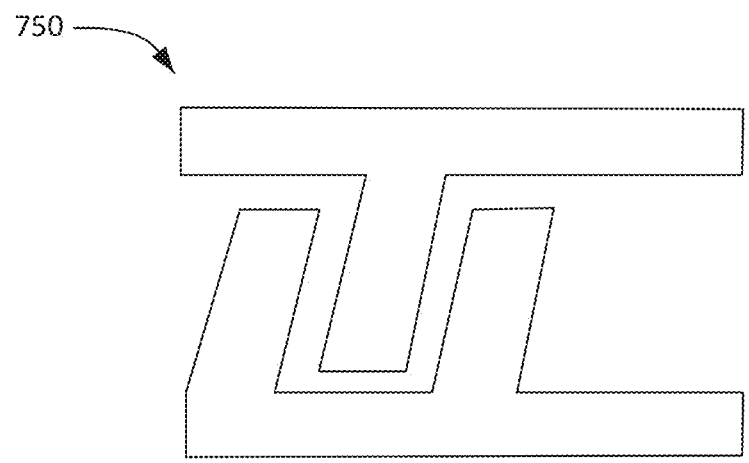
FIG. 7B is a graphic illustrating another non-rectangular electrode shape for a YBAR.

FIG. 7A is a graphic illustrating a non-rectangular electrode shape for a YBAR. In FIG. 7A, the conductor pattern 700 includes a first trapezoidal electrode shape and a corresponding second trapezoidal electrode shape, such that the first and second shapes can be interleaved with a constant distance between edges. FIG. 7B is a graphic illustrating another non-rectangular electrode shape for a YBAR. In FIG. 7B, the conductor pattern 750 includes a first parallelogram electrode shape and a corresponding second parallelogram electrode shape, such that the first and second shapes can be interleaved with a constant distance between edges. The non-rectangular electrode shapes of FIGS. 7A and 7B reduce or prevent undesirable wave reflections resulting in parasitic modes. The non-rectangular shapes are not limited to those shown in FIGS. 7A and 7B. The non-rectangular shapes can be more complicated shapes, such as curved fish-shapes or different inclinations.

Figure 8:
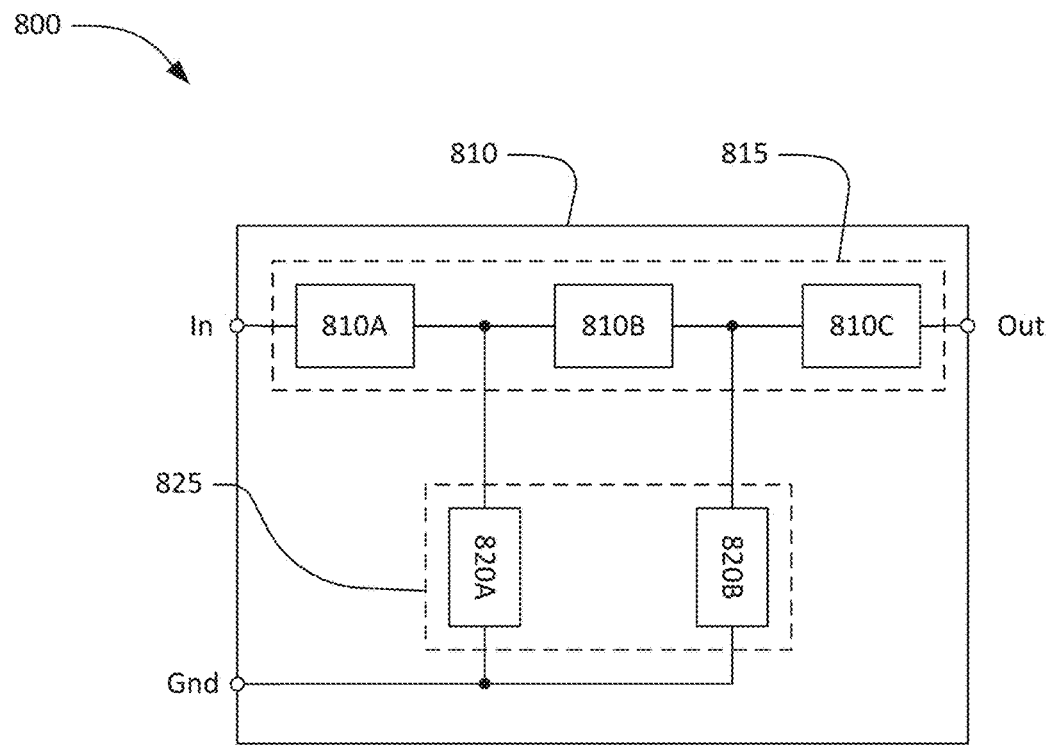
FIG. 8 is a schematic circuit diagram and layout of a filter using YBARs.

FIG. 8 is a schematic circuit diagram for a high frequency band-pass filter 800 using YBARs. The filter 800 has a conventional ladder filter architecture including three series resonators 810A, 810B, 810C and two shunt resonators 820A, 820B. The three series resonators 810A, 810B, and 810C are connected in series between a first port and a second port. In FIG. 8, the first and second ports are labeled "In" and "Out", respectively. However, the filter 800 is bidirectional and either port can serve as the input or output of the filter. The two shunt resonators 820A, 820B are connected from nodes between the series resonators to ground. All the shunt resonators and series resonators are YBARs.

The filter 800 may include a substrate having a surface and a single-crystal piezoelectric plate having parallel front and back surfaces, with a back-side conductor pattern coupled to the back surface for each YBAR. Back-side conductor patterns of the YBARs are electrically isolated from each other. The back-side conductor pattern can be like back-side conductor 134 of FIG. 1 or can be an acoustic Bragg reflector sandwiched between the surface of the substrate and the back surface of the single-crystal piezoelectric plate like acoustic Bragg reflector 240 of FIG. 2. In the example shown in FIG. 8, the substrate, acoustic Bragg reflector, and single-crystal plates are represented by the rectangle 810 in FIG. 8. A front-side conductor pattern formed on the front surface of the single-crystal piezoelectric plate includes a conductor pattern for each of the three series resonators 810A, 810B, 810C and two shunt resonators 820A, 820B. The conductor pattern can be similar to the front-side conductor patterns 130, 132 of FIG. 1, or the interleaved finger pattern (IFPs) 230, 232 of FIG. 2. All of the conductor patterns are configured to excite shear acoustic waves in the single-crystal piezoelectric plate in response to respective radio frequency signals applied to each conductor pattern.

In a ladder filter, such as the filter 800, the resonance frequencies of shunt resonators are typically lower than the resonance frequencies of series resonators. The resonance frequency of a YBAR is determined primarily by the thickness of the piezoelectric plate and conductor layers. The resonance frequency of a YBAR resonator also has a weak dependence on conductor pattern pitch. Conductor pattern pitch also impacts other filter parameters including impedance and power handling capability.

To reduce the resonance frequencies of some or all of the shunt resonators relative to the series resonators, a first dielectric layer (represented by the dashed rectangle 825) having a first thickness t1 may be deposited over the front-side conductor patterns of one or both of the shunt resonators 820A, 820B. A second dielectric layer (represented by the dashed rectangle 815) having a second thickness t2, less than t1 may be deposited over the front-side conductor patterns of the series resonators 810A, 810B, 810C. The thickness of each of the first and second dielectric layers may be between 0 and 300 nm, such that $0 < t2 < t1 < 300$ nm. The use of two different dielectric layer thicknesses may be appropriate in situations where a shift of at least 100 MHz is required between the resonance frequencies of series and shunt resonators. When the dielectric layers are silicon dioxide, $t1-t2 > 25$ nm is sufficient to cause a shift of at least 100 MHz between the resonance frequencies of series and shunt resonators.

Description of Methods

Figure 9:
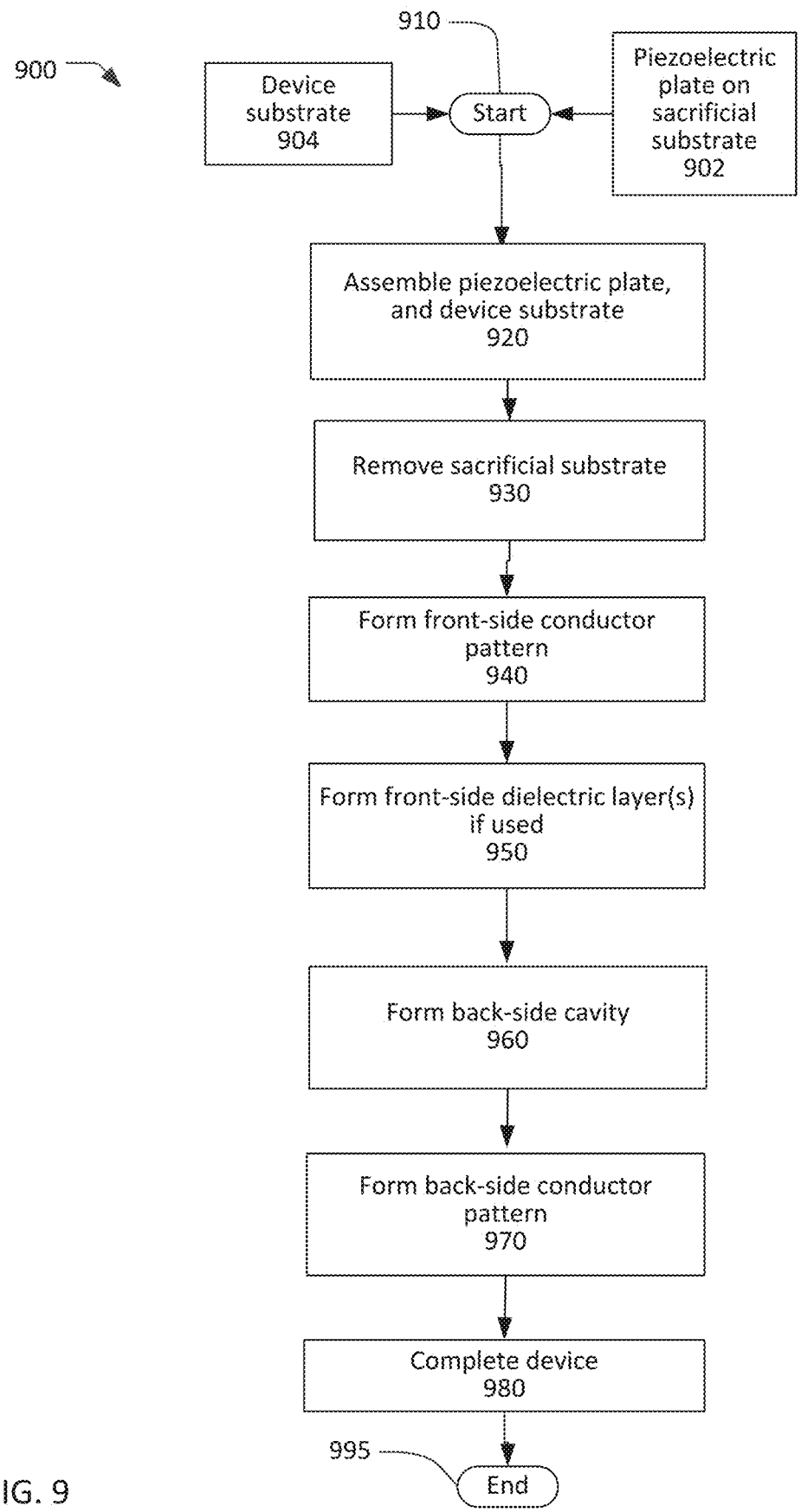
FIG. 9 is a flow chart of a process of fabricating a YBAR.

FIG. 9 is a simplified flow chart of a method 900 for making a YBAR or a filter incorporating YBARs, such as the YBAR of FIG. 1. The method 900 starts at 910 with a piezoelectric plate disposed on a sacrificial substrate 902 and a device substrate 904. The method 900 ends at 995 with a completed YBAR or filter. The flow chart of FIG. 9 includes only major process steps. Various conventional process steps (e.g. surface preparation, cleaning, inspection, baking, annealing, monitoring, testing, etc.) may be performed before, between, after, and during the steps shown in FIG. 9.

Thin plates of single-crystal piezoelectric materials bonded to a non-piezoelectric substrate are commercially available. At the time of this application, both lithium niobate and lithium tantalate plates are available bonded to various substrates including silicon, quartz, and fused silica. Thin plates of other piezoelectric materials may be available now or in the future. The thickness of the piezoelectric plate may be between 300 nm and 1000 nm. When the substrate is silicon, a layer of SiO2 may be disposed between the piezoelectric plate and the substrate. The piezoelectric plate 902 may be, for example, z-cut lithium niobate with a thickness of 400 nm (as used in all of the previous examples) bonded to a silicon wafer with an intervening SiO2 layer. The device substrate 904 may be silicon (as used in the previous examples) fused silica, quartz, or some other material.

At 920, the piezoelectric plate on the sacrificial substrate 902 and the device substrate 904 are bonded. In YBARs with a floating back-side conductor pattern as shown in FIG. 1, cavities in the device substrate 904 can be positioned to correspond with the back-side conductor pattern. The piezoelectric plate on the sacrificial substrate 902 and the device substrate 904 may be bonded using a wafer bonding process such as direct bonding, surface-activated or plasma-activated bonding, electrostatic bonding, or some other bonding technique.

After the piezoelectric plate on the sacrificial substrate 902 and the device substrate 904 are bonded, the sacrificial substrate, and any intervening layers, are removed at 930 to expose the surface of the piezoelectric plate (the surface that previously faced the sacrificial substrate). The sacrificial substrate may be removed, for example, by material-dependent wet or dry etching or some other process.

A front-side conductor pattern, such as front-side conductor pattern 130, 132 of FIG. 1, is formed at 940 by depositing and patterning one or more conductor layers on the surface of the piezoelectric plate that was exposed when the sacrificial substrate was removed at 930. The conductor pattern may be, for example, aluminum, an aluminum alloy, copper, molybdenum a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the front-side conductor pattern (for example the IFP bus bars and interconnections between the IFPs).

The front-side conductor pattern may be formed at 940 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques. Further, portions of the piezoelectric plate between the conductors of the front-side conductor pattern can be removed to form grooves in the piezoelectric plate between the conductors. For example, the portions can be removed during the same or a different etching process. The portions may be removed through an entire thickness of the piezoelectric plate or only to a certain depth.

Alternatively, the front-side conductor pattern may be formed at 940 using a lift-off process. Photoresist may be deposited over the piezoelectric plate. and patterned to define the front-side conductor pattern. The conductor layer and, optionally, one or more other layers may be deposited in sequence over the surface of the piezoelectric plate. The photoresist may then be removed, which removes the excess material, leaving the conductor pattern.

At 950, one or more optional front-side dielectric layers may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the front-side conductor pattern. Alternatively, one or more lithography processes (using photomasks) may be used to limit the deposition of the dielectric layers to selected areas of the piezoelectric plate, such as only between the interleaved fingers of the front-side conductor patterns. Masks may also be used to allow deposition of different thicknesses of dielectric materials on different portions of the piezoelectric plate. For example, a first dielectric layer having a first thickness t1 may be deposited over the front-side conductor patterns of one or more shunt resonators. A second dielectric layer having a second thickness t2, where t2 is equal to or greater than zero and less than t1, may be deposited over the conductor patterns of series resonators.

At 960, a back-side cavity is formed in the back side of the piezoelectric plate, where the cavity corresponds to the position of the front conductor pattern. The cavity may be formed using an anisotropic or orientation-dependent dry or wet etch to open a hole through the back-side of the substrate to the piezoelectric plate.

At 970, a back-side conductor pattern is formed on the back side of the piezoelectric plate. The back-side conductor pattern can be formed to be like back-side conductor pattern 134 of FIG. 1. The back-side conductor pattern can be formed by depositing and patterning one or more conductor layers on the back surface of the piezoelectric plate. The back-side conductor pattern may be, for example, aluminum, an aluminum alloy, copper, molybdenum a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate.

The back-side conductor pattern may be formed by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the back-side conductor pattern may be formed using a lift-off process. Photoresist may be deposited over the piezoelectric plate. and patterned to define the back-side conductor pattern. The conductor layer and, optionally, one or more other layers may be deposited in sequence over the surface of the piezoelectric plate. The photoresist may then be removed, which removes the excess material, leaving the back-side conductor pattern.

After the back-side conductor pattern is formed at 970, the filter device may be completed at 980. Actions that may occur at 980 including depositing and patterning additional metal layers to form conductors other than the conductor patterns; depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 980 is to tune the resonant frequencies of the resonators within the device by adding or removing metal or dielectric material from the front side of the device. After the filter device is completed, the process ends at 995.

A variation of the process 900 starts with a single-crystal piezoelectric wafer at 902 instead of a thin piezoelectric plate on a sacrificial substrate of a different material. Ions are implanted to a controlled depth beneath a surface of the piezoelectric wafer (not shown in FIG. 9). The portion of the wafer from the surface to the depth of the ion implantation is (or will become) the thin piezoelectric plate and the balance of the wafer is the sacrificial substrate. The back-side conductor pattern is formed, and the piezoelectric wafer and device substrate are bonded at 920. At 930, the piezoelectric wafer may be split at the plane of the implanted ions (for example, using thermal shock), leaving a thin plate of piezoelectric material exposed and bonded to the back-side conductor pattern. The thickness of the thin plate piezoelectric material is determined by the energy (and thus depth) of the implanted ions. The process of ion implantation and subsequent separation of a thin plate is commonly referred to as "ion slicing".

Figure 10:
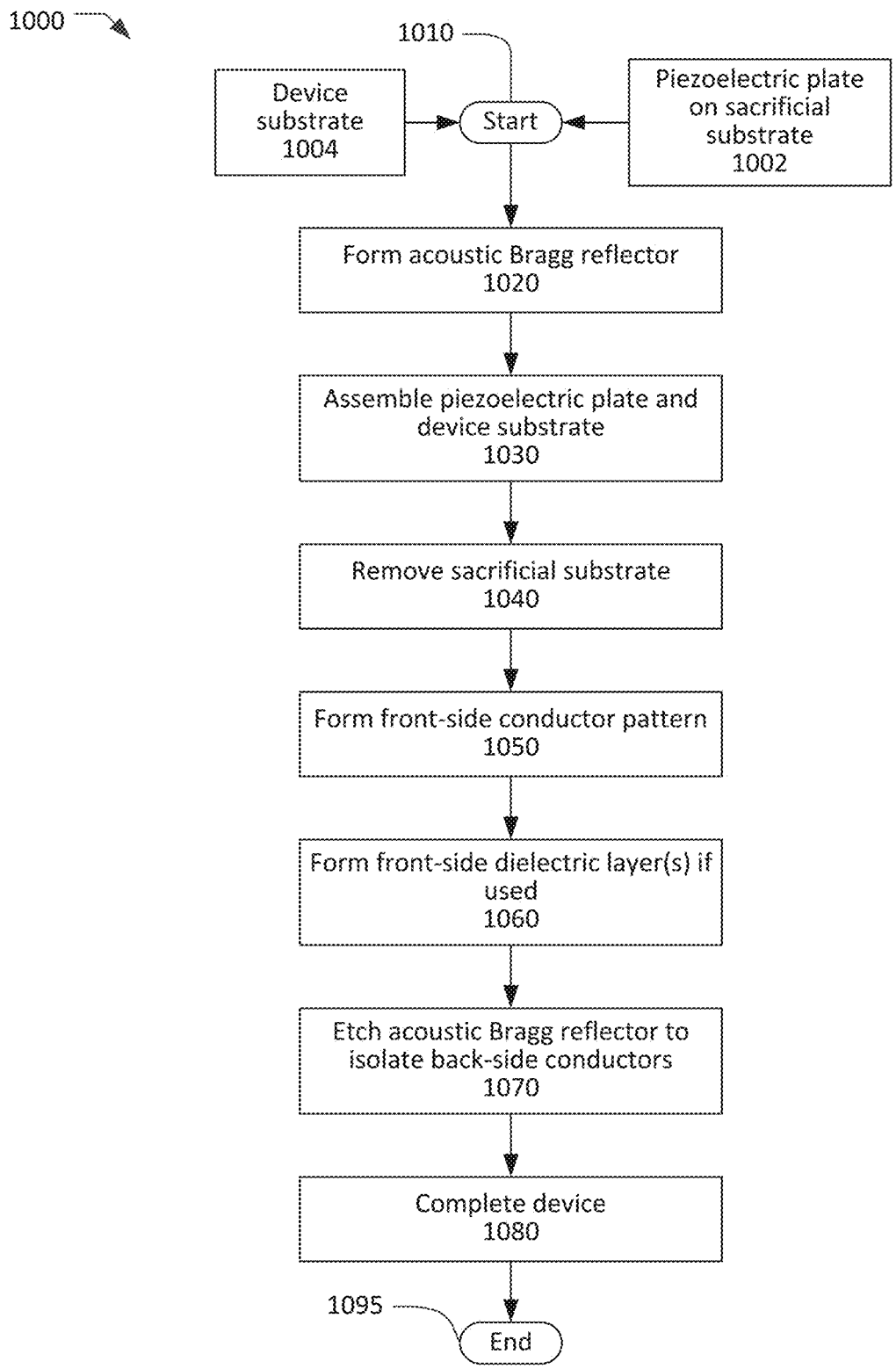
FIG. 10 is a flow chart of a process of fabricating a SM YBAR.

FIG. 10 is a simplified flow chart of a method 1000 for making a SM YBAR similar to that of FIG. 2. The method 1000 starts at 1010 with a piezoelectric plate disposed on a sacrificial substrate 1002 and a device substrate 1004. The method 1000 ends at 1095 with a completed YBAR or filter. The flow chart of FIG. 10 includes only major process steps. Various conventional process steps (e.g. surface preparation, cleaning, inspection, baking, annealing, monitoring, testing, etc.) may be performed before, between, after, and during the steps shown in FIG. 10.

Lithium niobate and lithium tantalate plates can be bonded to various substrates including silicon, quartz, and fused silica, where the thickness of the piezoelectric plate may be between 300 nm and 1000 nm. When the substrate is silicon, a layer of $SiO_2$ may be disposed between the piezoelectric plate and the substrate. The piezoelectric plate 1002 may be, for example, z-cut lithium niobate with a thickness of 400 nm (as used in all of the previous examples) bonded to a silicon wafer with an intervening $SiO_2$ layer. The device substrate 1004 may be silicon (as used in the previous examples) fused silica, quartz, or some other material.

At 1020, an acoustic Bragg reflector is formed by depositing alternating layers of high acoustic impedance and low acoustic impedance materials. One or more layers can be deposited either or both the piezoelectric plate and the device substrate. Each of the layers has a thickness equal to or about one-fourth of the acoustic wavelength. Materials having comparatively low acoustic impedance include silicon dioxide, silicon oxycarbide, aluminum, and certain plastics such as cross-linked polyphenylene polymers. Materials having comparatively high acoustic impedance include silicon nitride, aluminum nitride, and metals such as molybdenum, tungsten, gold, and platinum. All of the high acoustic impedance layers are not necessarily the same material, and all of the low acoustic impedance layers are not necessarily the same material. The total number of layers in the acoustic Bragg reflector may be from about five to more than twenty. In filters including multiple SM YBARs, the acoustic Bragg reflector can then be etched to electrically isolate each SM YBAR from the other SM YBARs.

At 1030, the piezoelectric plate on the sacrificial substrate 1002 and the device substrate 1004 are assembled. In YBARs with acoustic Bragg filter as shown in FIG. 2, the sacrificial substrate 1002 and the device substrate 1004 may be bonded such that the layers of the acoustic Bragg reflector are sandwiched between the piezoelectric plate and the device substrate. The piezoelectric plate on the sacrificial substrate 1002 and the device substrate 1004 may be bonded using a wafer bonding process such as direct bonding, surface-activated or plasma-activated bonding, electrostatic bonding, or some other bonding technique. Note that, when one or more layers of the acoustic Bragg reflector are deposited on both the piezoelectric plate and the device substrate, the bonding will occur between or within layers of the acoustic Bragg reflector.

After the piezoelectric plate on the sacrificial substrate 1002 and the device substrate 1004 are bonded, the sacrificial substrate, and any intervening layers, are removed at 1040 to expose the surface of the piezoelectric plate (the surface that previously faced the sacrificial substrate). The sacrificial substrate may be removed, for example, by material-dependent wet or dry etching or some other process.

A front-side conductor pattern, such as front-side conductor pattern 230, 232 of FIG. 2 including IFPs, is formed at 1050 by depositing and patterning one or more conductor layers on the surface of the piezoelectric plate that was exposed when the sacrificial substrate was removed at 1040. The conductor pattern may be, for example, aluminum, an aluminum alloy, copper, molybdenum a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the front-side conductor pattern (for example the IFP bus bars and interconnections between the IFPs).

The front-side conductor pattern may be formed at 1050 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques. Further, portions of the piezoelectric plate between the conductors of the front-side conductor pattern can be removed to form grooves in the piezoelectric plate between the conductors. For example, the portions can be removed during the same or a different etching process. The portions may be removed through an entire thickness of the piezoelectric plate or only to a certain depth.

Alternatively, the front-side conductor pattern may be formed at 1050 using a lift-off process. Photoresist may be deposited over the piezoelectric plate. and patterned to define the front-side conductor pattern. The conductor layer and, optionally, one or more other layers may be deposited in sequence over the surface of the piezoelectric plate. The photoresist may then be removed, which removes the excess material, leaving the conductor pattern.

At 1060, one or more optional front-side dielectric layers may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the front-side conductor pattern. Alternatively, one or more lithography processes (using photomasks) may be used to limit the deposition of the dielectric layers to selected areas of the piezoelectric plate, such as only between the interleaved fingers of the front-side conductor patterns. Masks may also be used to allow deposition of different thicknesses of dielectric materials on different portions of the piezoelectric plate. For example, a first dielectric layer having a first thickness t1 may be deposited over the front-side conductor patterns of one or more shunt resonators. A second dielectric layer having a second thickness t2, where t2 is equal to or greater than zero and less than t1, may be deposited over the conductor patterns of series resonators.

At 1070, in filters including multiple SM YBARs, the acoustic Bragg reflector can be etched to electrically isolate the back-side conductor of each SM YBAR from the other SM YBARs. Portions of the acoustic Bragg reflector may be removed by etching through a patterned photoresist, for example, by plasma etching, reactive ion etching, wet chemical etching, and other etching techniques.

The filter device may then be completed at 1080. Actions that may occur at 1080 including depositing and patterning additional metal layers to form conductors other than the conductor patterns; depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1080 is to tune the resonant frequencies of the resonators within the device by adding or removing metal or dielectric material from the front side of the device. After the filter device is completed, the process ends at 1095.

A variation of the process 1000 starts with a single-crystal piezoelectric wafer at 1002 instead of a thin piezoelectric plate on a sacrificial substrate of a different material. Ions are implanted to a controlled depth beneath a surface of the piezoelectric wafer (not shown in FIG. 10). The portion of the wafer from the surface to the depth of the ion implantation is (or will become) the thin piezoelectric plate and the balance of the wafer is the sacrificial substrate. The back-side conductor pattern is formed, and the piezoelectric wafer and device substrate are bonded at 1020. At 1030, the piezoelectric wafer may be split at the plane of the implanted ions (for example, using thermal shock), leaving a thin plate of piezoelectric material exposed and bonded to the back-side conductor pattern. The thickness of the thin plate piezoelectric material is determined by the energy (and thus depth) of the implanted ions. The process of ion implantation and subsequent separation of a thin plate is commonly referred to as "ion slicing"

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
    a single-crystal piezoelectric plate having a front surface and a back surface opposite the front surface, wherein the back surface is coupled to a surface of a substrate;
    a floating back-side conductor pattern formed on the back surface; and
    a front-side conductor pattern comprising two electrodes formed on a portion of the front surface opposite the back-side conductor pattern, wherein the front-side conductor pattern comprises interleaved fingers connected to busbars of opposite polarity, and wherein the interleaved fingers have a non-rectangular shape.

2. The device of claim 1, wherein a radio frequency signal applied between the two electrodes excites a primary acoustic mode in the single-crystal piezoelectric plate.

3. The device of claim 1, wherein the back-side conductor pattern is an acoustic Bragg reflector.

4. The device of claim 3, wherein the acoustic Bragg reflector is between the surface of the substrate and the back surface of the single-crystal piezoelectric plate.

5. The device of claim 1, wherein a portion of the single-crystal piezoelectric plate between the two electrodes is recessed to form a slot.

6. A method of fabricating an acoustic resonator device comprising:
    coupling a back surface of a single-crystal piezoelectric plate to a substrate, the single-crystal piezoelectric plate having a front surface opposite the back surface;
    forming a floating back-side conductor pattern on the back surface; and
    forming a front-side conductor pattern consisting of two electrodes on a portion of the front surface opposite the back-side conductor pattern, wherein the front-side conductor pattern comprises interleaved fingers connected to busbars of opposite polarity, and wherein the interleaved fingers have a non-rectangular shape.

7. The method of claim 6, wherein a radio frequency signal applied between the two electrodes excites a primary acoustic mode in the single-crystal piezoelectric plate.

8. The method of claim 6, wherein the back-side conductor pattern is an acoustic Bragg reflector.

9. The method of claim 8, wherein the acoustic Bragg reflector is between the substrate and the back surface of the single-crystal piezoelectric plate.

10. The method of claim 6, wherein a portion of the single-crystal piezoelectric plate between the two electrodes is removed to form a slot.

11. An acoustic resonator device comprising:
    a single-crystal piezoelectric plate having a front surface and a back surface opposite the front surface, wherein the back surface is coupled to a surface of a substrate;
    a floating back-side conductor pattern formed on the back surface; and
    a front-side conductor pattern comprising two electrodes formed on a portion of the front surface opposite the back-side conductor pattern, wherein a portion of the single-crystal piezoelectric plate between the two electrodes is recessed to form a slot.

12. The device of claim 11, wherein a radio frequency signal applied between the two electrodes excites a primary acoustic mode in the single-crystal piezoelectric plate.

13. The device of claim 11, wherein the back-side conductor pattern is an acoustic Bragg reflector.

14. The device of claim 13, wherein the acoustic Bragg reflector is between the surface of the substrate and the back surface of the single-crystal piezoelectric plate.

15. A method of fabricating an acoustic resonator device comprising:
    coupling a back surface of a single-crystal piezoelectric plate to a substrate, the single-crystal piezoelectric plate having a front surface opposite the back surface;
    forming a floating back-side conductor pattern on the back surface; and
    forming a front-side conductor pattern consisting of two electrodes on a portion of the front surface opposite the back-side conductor pattern, wherein a portion of the single-crystal piezoelectric plate between the two electrodes is recessed to form a slot.

16. The method of claim 15, wherein a radio frequency signal applied between the two electrodes excites a primary acoustic mode in the single-crystal piezoelectric plate.

17. The method of claim 15, wherein the back-side conductor pattern is an acoustic Bragg reflector.

18. The method of claim 15, wherein the acoustic Bragg reflector is between the substrate and the back surface of the single-crystal piezoelectric plate.

* * * * *